United States Patent
Seo et al.

(10) Patent No.: US 7,767,021 B2
(45) Date of Patent: Aug. 3, 2010

(54) GROWING METHOD OF SIC SINGLE CRYSTAL

(75) Inventors: Soo-Hyung Seo, Gyeonggi-Do (KR);
Joon-Suk Song, Gyeonggi-do (KR);
Myung-Hwan Oh, Gyeonggi-Do (KR)

(73) Assignee: NeosemiTech Corporation, Seoul (KR)

( * ) Notice: Subject to any disclaimer, the term of this patent is extended or adjusted under 35 U.S.C. 154(b) by 0 days.

(21) Appl. No.: 11/529,115

(22) Filed: Sep. 28, 2006

(65) Prior Publication Data

US 2007/0068449 A1 Mar. 29, 2007

(30) Foreign Application Priority Data

Sep. 29, 2005 (KR) .................. 10-2005-0091008
Sep. 29, 2005 (KR) .................. 10-2005-0091014
Jul. 12, 2006 (KR) .................. 10-2006-0065463
Jul. 12, 2006 (KR) .................. 10-2006-0065464

(51) Int. Cl.
*C30B 25/00* (2006.01)

(52) U.S. Cl. .................. 117/105; 117/84; 117/88; 117/951; 117/957; 501/87; 501/88; 423/345

(58) Field of Classification Search .................. 117/1, 117/84, 88, 105, 951, 957; 257/1; 438/1; 423/1, 345; 501/87, 88

See application file for complete search history.

(56) References Cited

U.S. PATENT DOCUMENTS

| | | | | |
|---|---|---|---|---|
| 4,372,902 A * | 2/1983 | Denton et al. | ............... | 264/674 |
| 4,613,490 A * | 9/1986 | Suzuki et al. | ............... | 423/344 |
| 5,093,039 A * | 3/1992 | Kijima et al. | ............... | 252/516 |
| 5,211,801 A * | 5/1993 | Stein | ............... | 117/84 |
| 5,380,511 A * | 1/1995 | Arahori et al. | ............... | 423/345 |
| 5,723,880 A * | 3/1998 | Stan et al. | ............... | 257/77 |
| 5,863,325 A * | 1/1999 | Kanemoto et al. | .......... | 117/105 |
| 6,110,279 A * | 8/2000 | Kito et al. | ............... | 117/105 |
| 2004/0050320 A1* | 3/2004 | Maruyama et al. | ............ | 117/84 |

FOREIGN PATENT DOCUMENTS

JP      06128094 A  *  5/1994

OTHER PUBLICATIONS

English abstract of JP 6-128094A (1994).*

* cited by examiner

*Primary Examiner*—Robert M Kunemund
*Assistant Examiner*—Matthew J Song
(74) *Attorney, Agent, or Firm*—Avery N. Goldstein

(57) ABSTRACT

A growing method of a SiC single crystal includes the steps of thermal treatment of a high purity SiC source for decreasing a specific surface area and increasing a ratio of α-phase and making a mole fraction of C greater than that of Si in the source, providing the SiC source into a crucible, arranging a SiC seed in the crucible, and growing the SiC single crystal by heating the SiC source.

11 Claims, 10 Drawing Sheets

GROWING METHOD OF SIC SINGLE CRYSTAL

CROSS REFERENCE TO RELATED APPLICATION

This application claims priority to and the benefit of Korean Patent Applications Nos. 10-2005-0091008 and 10-2005-0091014 filed on Sep. 29, 2005 and Korean Patent Application Nos. 10-2006-0065463 and 10-2006-0065464 filed on Jul. 12, 2006 in the Korean Intellectual Property Office, the contents of which are incorporated herein by reference.

BACKGROUND OF THE INVENTION (a) Field of the Invention

The present invention is related to a growing method of a SiC single crystal, and in particular, to a growing method of a high quality SiC single crystal that has only small amounts of defects.

(b) Description of the Related Art

Broadband semiconductor materials, such as SiC, GaN, AlN, and ZnO, have been noticed as promising next generation semiconductor device materials.

However, since the growth technology of a single crystal ingot is not secured, only SiC single crystal material can be used in a substrate having a diameter of 2 inches or greater among these broadband semiconductor materials.

SiC has excellent thermal stability at 1500° C. or less and also has excellent stability in an oxidizing atmosphere. It also has a high thermal conductivity of 4.6 W/cm° C.

Thus, in the case that high stability at high temperature for a long time is required, SiC promises to be much more useful than III-V group compound semiconductors, such as GaAs or GaN.

Though the electron mobility of SiC is lower than that of Si, it has a band gap two or three times as much as Si.

Thus, SiC has a much higher operation limit temperature than Si. In addition, since it has high chemical stability and high mechanical strength, it can be used in a device that can be used in extreme environmental conditions.

The performance limitation of a device caused by the difference of intrinsic properties of these materials can be expressed by a FOM (Figure of Merit) such as JFOM (Johnson's Figure of Merit), KFOM (Keyes' Figure of Merit), BFOM (Baliga's Figure of Merit) and BHFFOM (Baliga's High Frequency Figure of Merit) easily.

JFOM is an indicator of high frequency performance of a material. JFOM is a comparative coefficient of a power of a transistor and a limit of a frequency induced from a break down voltage and a saturation electronic speed. JFOM of SiC is 600 times or greater than that of Si.

Devices developed by using SiC having such excellent properties are announced day by day. Accordingly, the scope of application of SiC is becoming very wide and its ripple effect is being enlarged at very fast pace.

As to the applications of high frequency devices for communication, a single crystal substrate having high resistivity ($10^3$ ohm-cm or greater) is required.

For this application, a high quality substrate having only small amounts of defects is required.

The high quality substrate generally indicates a substrate in which the number of micro pipes per unit area and the dislocation per unit area generated in a SiC single crystal are small.

Moreover, the generation of defects is very closely related to the SiC source, purity of the crucible material, and fine dust.

Among these, the SiC source used in the growth has a large influence on the generation of the defects. Particularly, even if a high purity SiC source is used in the growth, the defects may be generated due to the residual metallic Si not reacted with a carbon in the high SiC purity source.

In addition, in order to be adapted to high brightness and high power type LEDs (light emitting diodes) and LDs (Laser Diodes), and a power device, the SiC substrate should be a low resistance substrate that can embody a vertical type diode structure.

A high quality substrate in which the stacking defect and the other crystal defects are minimized is required for these applications.

Nitrogen is generally used as a doping source in order to embody an n-type impurity in the SiC single crystal growth. If the nitrogen is intentionally over-added in order to increase the doping concentration, the defects, including the stacking defect that is fatal to the characteristics of a device, may be generated.

SUMMARY OF THE INVENTION

It is an object of the present invention to provide a growing method of a high quality SiC single crystal with high electrical resistance by preventing the generation of crystal defects and the nitrogen incorporation due to the metallic Si.

It is another object of the present invention to provide a growing method of a single crystal having low electrical resistance with very low stacking faults and other defect under relatively low additional condition of nitrogen source.

These objects may be achieved by a growing method of a SiC single crystal with the following features.

A growing method of a SiC single crystal includes the steps of thermal treatment of a SiC source for decreasing a specific surface area and increasing a ratio of α-phase and making a mole fraction of C greater than that of Si in the source, providing the SiC source into a crucible, arranging a SiC seed in the crucible, and growing the SiC single crystal by heating the SiC source.

The thermal treatment of the SiC source may be carried out at a temperature of 1500 to 2600° C. and at a pressure of 50 to 4000 Torr.

A hydrocarbon gas may be mixed with the SiC source during the thermal treatment step.

The SiC source may contain an a-phase SiC powder equal or greater than 10 vol % through the step of the thermal treatment.

The method may further include the step of adding high purity Si and performing a second thermal treatment after the first thermal treatment of the SiC source.

The second thermal treatment step may be carried out at a temperature of 1300 to 2500° C. and at a pressure of 50 to 3000 Torr, and 0.05 to 3 wt % of high purity Si may be added to the SiC source. The high purity Si may be a Si powder or a Si compound gas.

The Si compound gas may be silane, silicon chloride, or an organic silicon compound.

The SiC seed may have a hexagonal (6H, 4H, 2H) structure of which a diameter is equal or less than 8 inches.

The single crystal may be grown from one of the SiC seed orientations of {0001}, {1100}, {1120}, and {0338}.

In the step of growing the SiC single crystal, a hydrocarbon gas with He or $H_2$ gas may be supplied, and a $SiH_4$ gas may be supplied with the He gas. In the growing step, a 4H, 6H, 3C, or 15R poly type SiC single crystal may be grown on the SiC seed.

DETAILED DESCRIPTION OF THE EMBODIMENTS

The present invention will be described more fully hereinafter with reference to the accompanying drawings, in which preferred embodiments of the invention are shown.

Figure 1:
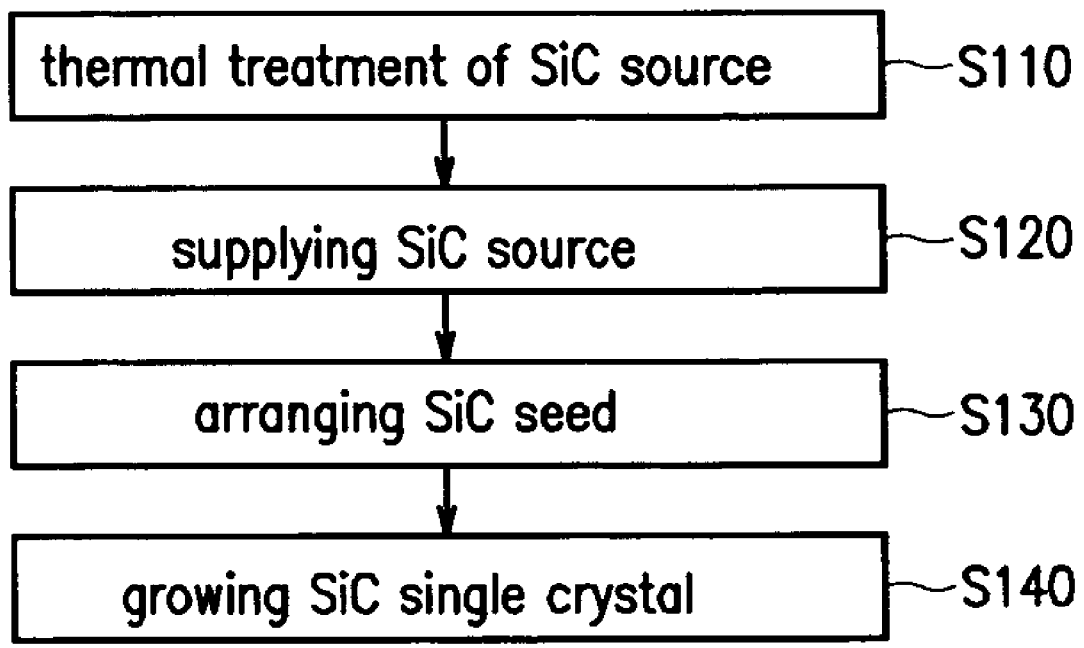
FIG. 1 is a flowchart of a growing method of a SiC single crystal according to a first exemplary embodiment of the present invention.

FIG. 1 is a flowchart of a growing method of a SiC single crystal according to a first exemplary embodiment of the present invention.

As shown in FIG. 1, the growing method includes a step of thermal treatment of a SiC source S110, a step of supplying the SiC source into a crucible S120, a step of arranging a SiC seed in the crucible S130, and a step of growing a SiC single crystal by heating the SiC source S140.

The step of thermal treatment of the SiC source S110 will be described hereinafter.

A high purity SiC powder can be used as the SiC source. The thermal treatment step of the SiC source S110 may be carried out at a temperature of 1500 to 2600° C. and at a pressure of 50 to 4000 Torr for 1 to 48 hours.

Since 1500° C. is a minimum transition temperature between a β-SiC and an α-SiC, the β-SiC does not transit to α-SiC below 1500° C. In addition, when the thermal treatment temperature is more than 2600° C., the SiC source may be carbonized. Accordingly, a preferable thermal treatment temperature is between 1500 and 2600° C.

In addition, it is hard to prevent substance transportation from the heated source at a pressure of less than 50 Torr, while when the pressure is more than 4000 Torr during the thermal treatment, a chamber that is made from quartz may not stand the pressure.

Thus, it is desirable to perform the thermal treatment at a pressure of 50 to 4000 Torr. However, the thermal treatment can be carried out at pressures of greater than 4000 Torr according to conditions of the chamber.

Meanwhile, the thermal treatment may be performed for between 1 to 48 hours. When the thermal treatment is performed for less than 1 hour, the transition from the β-phase to the α-phase and the change of porous powder are not sufficient.

When the thermal treatment is performed for more than 48 hours, a complex process of grinding the SiC source may be needed, and the SiC powder can be carbonized due to a loss of the Si.

Accordingly, it is desirable that the thermal treatment is performed for between 1 to 48 hours. However, since the time of the thermal treatment is related to the temperature, the thermal treatment can be performed for a relatively short time at a relatively high temperature, i.e., greater than 1900° C. It is also possible to perform the thermal treatment for a relatively long time at a relatively low temperature, i.e., less than 1900° C.

In addition, when the thermal treatment is performed for more than 3 hours at 1900° C. and between 50 and 4000 Torr, the loss of the Si may occur from the SiC source due to the substance transportation. Thus, at pressures, i.e., about between 50 and 4000 Torr, it is desirable to perform the thermal treatment for a short time at a relatively high temperature.

The specific surface area of the SiC powder may be decreased, the amount of the α-phase SiC may be increased, and the relative concentration of a residual metallic Si may be decreased through the thermal treatment described above.

Accordingly, generation of Si micro-droplets may be held back by lowering the partial pressure of Si vapor in the domain in which the SiC single crystal is actually grown. Thus, the generation of micro pipes may be held back, and a semi-insulating SiC can be grown in a condition that a mole fraction of the silicon is less than that of the carbon in the source.

However, when the α-phase is less than 10 vol % in the SiC source after the thermal treatment of the SiC source, SiC poly crystal may be formed due to a high Si vapor pressure.

Thus, it is desirable to perform a thermal treatment so as to form 10 vol % or more of the α-phase SiC powder.

Meanwhile, in the step of the thermal treatment, a hydrocarbon group gas may be mixed with the SiC source so as to prevent the generation of the residual metallic Si by increasing carbon content.

In addition, by the thermal treatment of the SiC source, carbon contents in the SiC source may be increased, thus generation probability of carbon atom vacancies may be decreased.

Accordingly, the incorporation of the residual nitrogen to the vacancy site of the carbon atom may be suppressed such that the growth of a semi-insulating SiC single crystal becomes advantageous.

The step of supplying the thermally treated SiC source into a crucible S120 will be described hereinafter. The thermal treated SiC source is supplied to the crucible of a crystallization apparatus.

Figure 2:
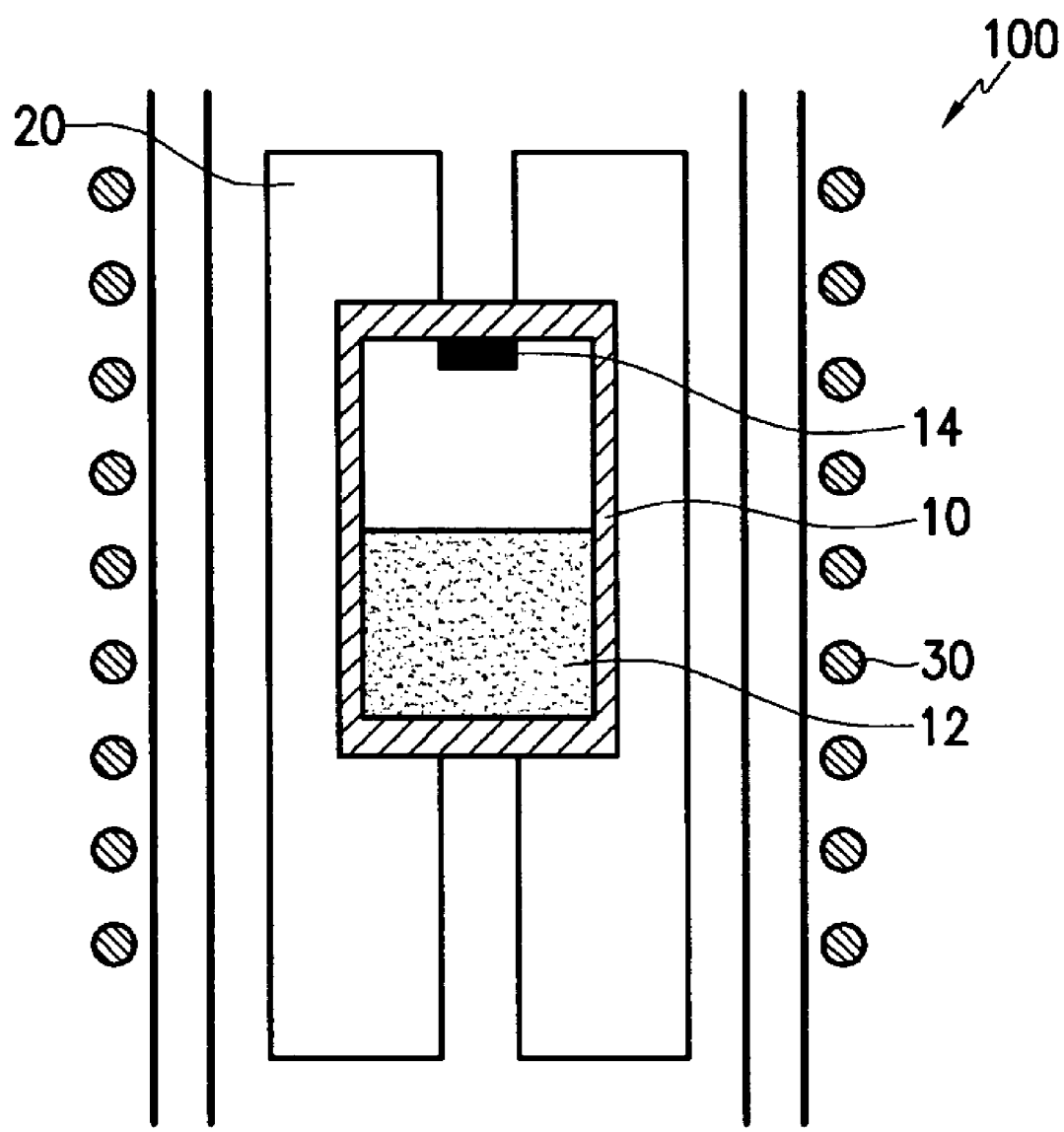
FIG. 2 is a schematic view of a sublimation crystallization apparatus.

FIG. 2 shows an example of a crystallization apparatus. As shown in FIG. 2, the crystallization apparatus 100 includes a crucible 10 in which the SiC source 12 is supplied and a SiC seed 14 is arranged, a heat insulator 20 surrounding the crucible 10, and an induction coil 30 for heating the crucible 10.

In addition, temperature measuring apparatuses may be installed at upper and lower portions of the crucible 10. The crucible 10 may be formed in a cylindrical shape; however the crucible 10 can also be formed in other shapes.

The crucible 10 may be made of a material that has a melting point higher than the sublimation temperature of the SiC. For example, the crucible 10 may be made of graphite, a metal, or a metal compound, which have a high heat-resisting property.

More specially, the crucible 10 can be made of a metal such as Ta, Hf, Nb, Zr, W, and V, metal carbides of these elements, or metal nitrides of these elements.

The crucible 10 can also be made of carbide consisting of a carbon and a mixture of two or more of these elements or a nitride consisting of nitrogen and a mixture of two or more of these elements.

The heat insulator 20 is arranged to be concentric to the crucible 10 and surrounds the crucible 10. In this case, a bottom plane and a center of a cover surface of the crucible 10 are exposed while not being surrounded by the heat insulator 20 such that the temperature can be measured.

In addition, the induction coil 30 for heating the crucible 10 is disposed outside of the heat insulator 20 in order to form a temperature gradient.

However, the scope of the present invention is not limited to the structure of the crystallization apparatus, various crystallization apparatuses may be used for growing the SiC single crystal.

The step of arranging the SiC single crystal seed in the crucible S130 will be described hereinafter. As shown in FIG. 2, a SiC seed 14 may be arranged at an upper portion of the crucible 10. However, the SiC seed 14 can also be arranged at a bottom plane of the crucible 10.

The SiC seed 14 is a SiC crystal from which crystallization is started and can be formed in a plate (or a disk) like shape.

A SiC single crystal having a hexagonal (6H, 4H, 2H), cubic (3C), or rhombohedral (15R) structure can be used as the SiC seed 14.

When the SiC seed 14 has a hexagonal structure, a plane of the seed from which the single crystal growth is started may have one of the crystal orientations among {0001}, {1100}, {1120}, and {0338}.

When the SiC seed 14 has a cubic structure, a plane of the seed from which the single crystal growth is started may have one of the crystal orientations among {100}, {110}, and {111}.

When the SiC seed 14 has a rhombohedral structure, a plane of the seed from which the single crystal growth is started may have one of the crystal orientations among {100}, {110}, and {111}.

More preferably, the SiC seed 14 may have a hexagonal structure, and a plane of the seed from which the single crystal growth is started may have one of the crystal orientations among {0001}, {1100}, {1120}, and {0338}.

In addition, the SiC seed 14 may be formed in a plate like shape, such as a square, a half circle, and a circle, and may have a diameter of 2 inches.

The step of growing the SiC single crystal S140 will be described hereinafter. The SiC single crystal can be grown by one of the methods between a sublimation method and a hybrid sublimation method.

A method of growing the single crystal by the sublimation method will be described referring to FIG. 2. When the SiC single crystal is grown by the sublimation method, SiC powder can be used as the SiC source.

The crucible 10 is heated by the induction coil 30 in order to grow the SiC single crystal. Accordingly, the temperature of the SiC source and the SiC seed supplied in the crucible 10 may rise.

The temperatures of the SiC source and the SiC seed are measured respectively by the temperature measuring apparatuses arranged at the upper and lower portions of the crucible 10.

In this case, the temperature of the SiC seed is preferably between 1700 and 2400° C., and the temperature of the SiC source is preferably between 1800 and 2500° C. The SiC single crystal grows gradually from a plane of the SiC seed that is heated in this way.

Figure 3:
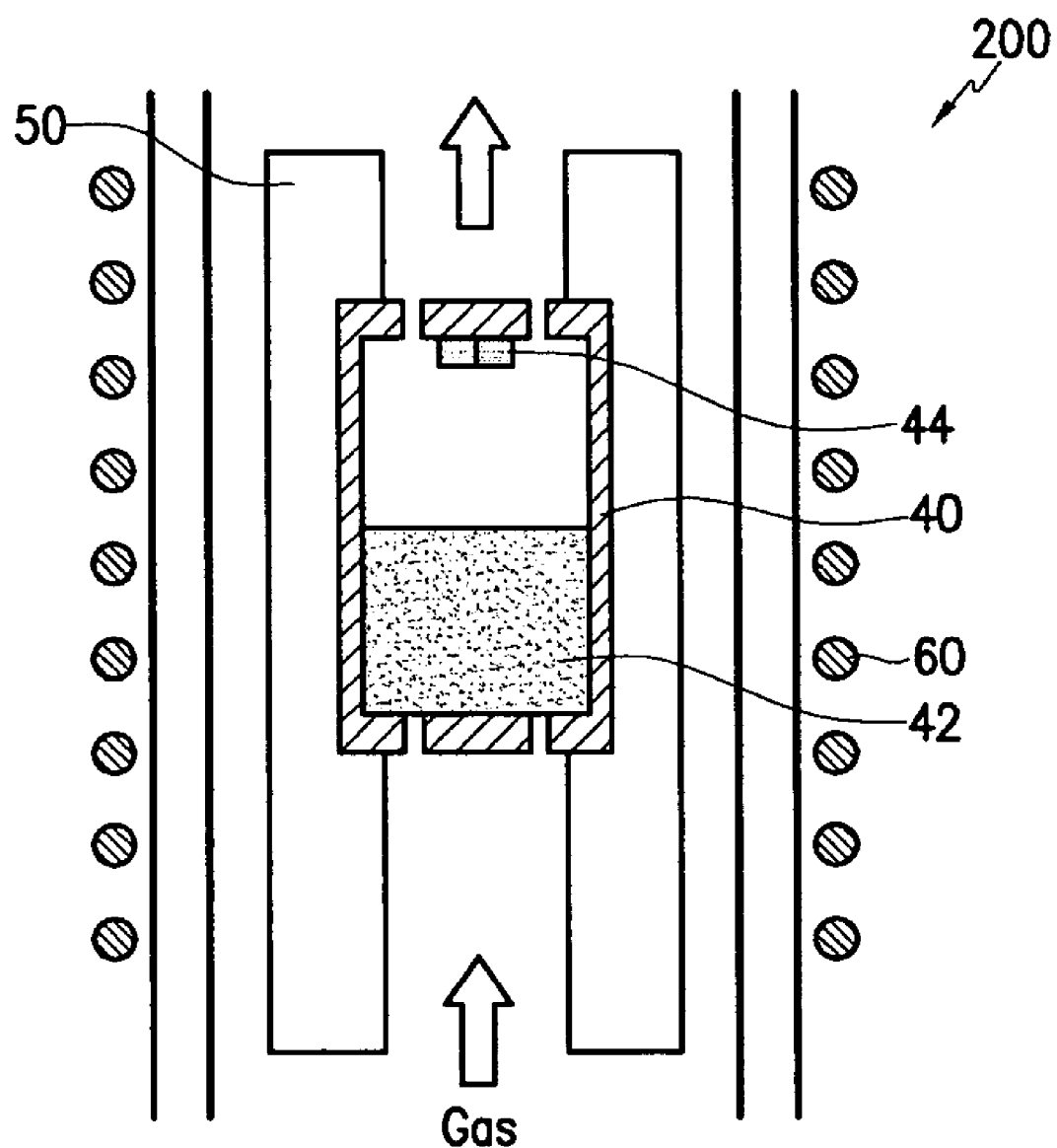
FIG. 3 is a schematic view of a hybrid sublimation crystallization apparatus.

FIG. 3 shows a crystallization apparatus 200 using a hybrid sublimation method. A method of growing a single crystal by the hybrid sublimation method will be described hereinafter referring to FIG. 3.

SiC powder is arranged in the crucible 40 as a SiC source 42, and a SiC seed 44 is arranged at upper portion of the crucible 40. However, the SiC seed 44 may also be arranged at lower portion of the crucible 40. In addition, the heat insulator 50 and the induction coil 60 are disposed outside of the crucible 40. The crucible 40 is heated by the induction coil 60, and the SiC source 42 is sublimated such that the single crystal is grown.

However, when the hybrid sublimation method is used, a hydrocarbon gas such as $C_3H_8$ and $C_2H_4$ can be supplied with a carrier gas such as He and $H_2$ as a carbon source in addition to the SiC powder.

In addition, a gas such as $SiH_4$ can be supplied with the carrier gas such as He and $H_2$ as a Si source.

FIG. 3 shows that the gas is supplied form the lower portion of the crucible 10 exhausted to the upper portion of the crucible 10 as an example.

By using the sublimation or hybrid sublimation methods, the SiC single crystal is grown to a diameter of 2 to 8 inches. In this case, a 4H, 6H, 3C, or 15R poly type SiC single crystal can be grown on the SiC seed.

A growing method of a SiC single crystal according to a second exemplary embodiment of the present invention will be described hereinafter. A SiC single crystal having a low resitivity is grown in the second exemplary embodiment.

Figure 4:
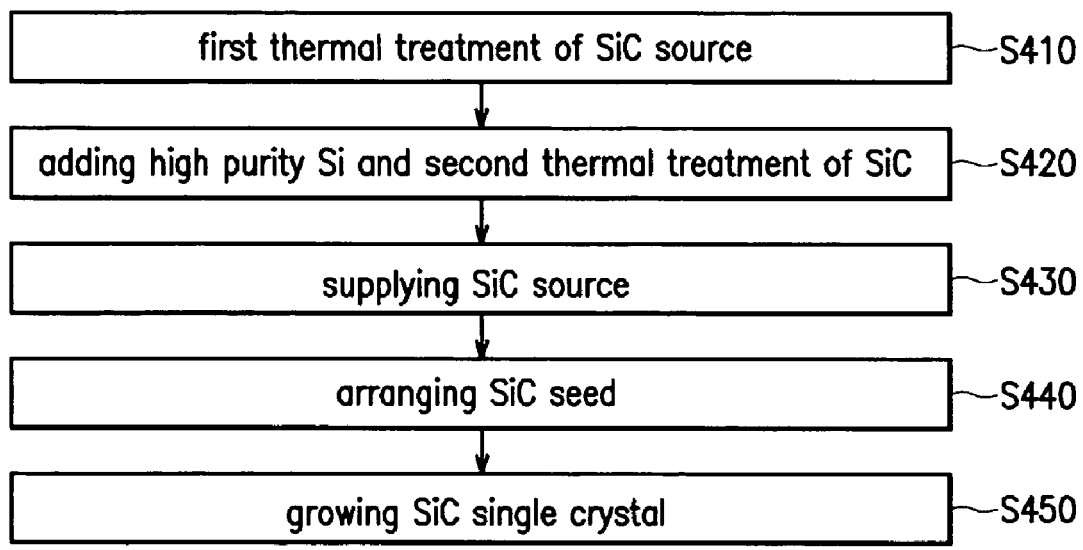
FIG. 4 is a flowchart of a growing method of a SiC single crystal according to a second exemplary embodiment of the present invention.

FIG. 4 is a flowchart showing the growing method of a SiC single crystal according to the second exemplary embodiment of the present invention.

As shown in FIG. 4, the growing method of the SiC single crystal includes the steps of a first thermal treatment S410, adding high purity Si to a SiC source and performing a second thermal treatment S420, supplying the SiC source into a crucible S430, arranging a SiC seed in the crucible S440, and growing the SiC single crystal by heating the SiC source S450.

The step of the first thermal treatment of the Si source S410, the step of supplying the Si source S430, the step of arranging the SiC seed S440, and the step of growing the SiC single crystal S450 are the same with the first exemplary embodiment described above, and thus a detailed description of these steps will be omitted. The second thermal treatment step S420 will be described hereinafter.

0.05 to 3 wt % of high purity Si may be added to the SiC source. The second thermal treatment may be carried out at a temperature of between 1300 to 2300° C. and at a pressure of between 50 to 4000 Torr.

A high purity Si powder can be added as the high purity Si. A silicon compound gas such as silane, silicon chloride, and an organic silicon compound can also be added during the thermal treatment as the high purity Si.

In this way, an excess Si content may be formed in the SiC source by the addition of the high purity Si and the thermal treatment.

When the additional Si contents are less than 0.05 wt %, the Si contents in the SiC source are not sufficient, while, when the additional Si contents are greater than 3 wt %, a SiC poly crystal may be formed due to the high Si vapor pressure. Thus, it is desirable to add Si of between 0.05 to 3 wt %.

In addition, the minimum temperature at which the Si is reacted with the SiC powder is 1300° C. When the second thermal treatment is performed at a temperature greater than 2500° C., the SiC source may be carbonized. Accordingly, it is desirable to perform the second thermal treatment at a temperature of between 1300 to 2500° C.

In addition, it is hard to prevent substance transportation from the heated source under the pressure of less than 50 Torr, while, when the pressure is more than 4000 Torr during the thermal treatment, a chamber that is made of quartz may not stand the pressure.

Thus, it is desirable to perform the second thermal treatment at a pressure of between 50 to 4000 Torr. However, the second thermal treatment can be carried out at pressures of greater than 4000 Torr according to the conditions of the chamber.

Since the time of the thermal treatment is related to the temperature, the second thermal treatment can be performed for a relatively short time at a relatively high temperature, i.e., greater than 1900° C. It is also possible to perform the second thermal treatment for a relatively long time at a relatively low temperature, i.e., less than 1900° C.

In addition, when the thermal treatment is performed for more than 3 hours at 1900° C. and between 50 and 4000 Torr, the loss of Si may occur from the SiC source due to the substance transportation. Thus, at pressure, i.e., about between 50 and 4000 Torr, it is desirable to perform the thermal treatment for a short time at a relatively high temperature.

In this way, an excess Si content ratio is formed through the addition of Si and the second thermal treatment.

Experimental examples that show effects of the present invention will be described hereinafter. However, the scope of the present invention is not limited to the following examples.

Experimental Example 1

Thermal treatment of a SiC powder source was performed under the conditions of 2100° C., 600 Torr for 2 to 13 hours.

Figure 5:
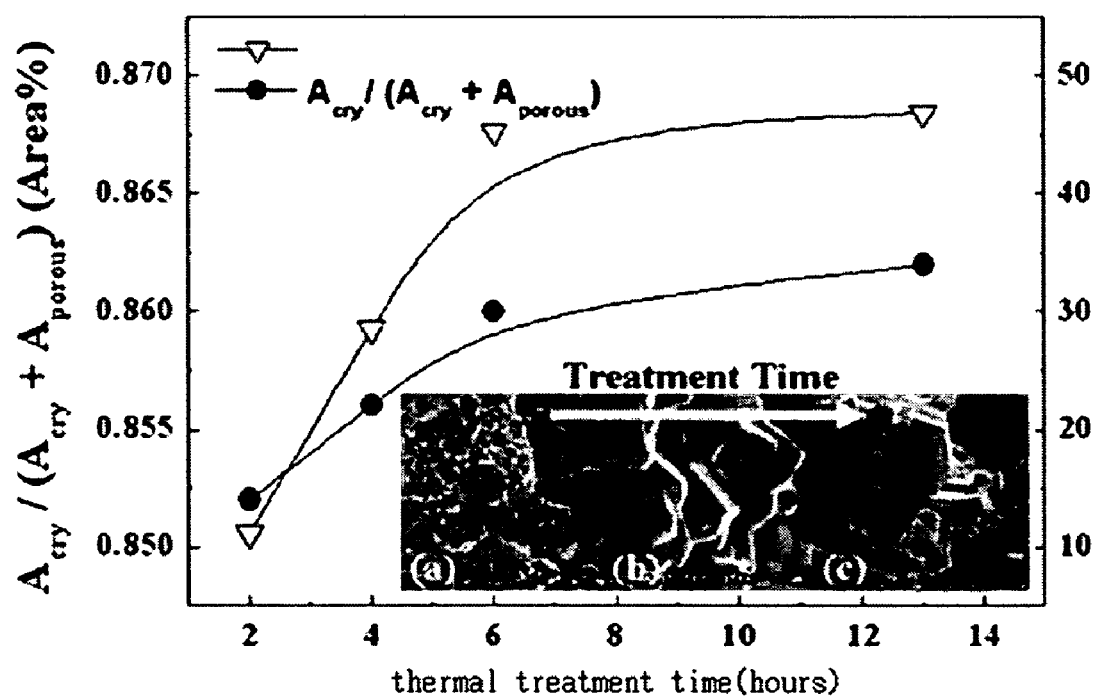
FIG. 5 is a graph showing a change of amount of porous powder and α-phase SiC according to the thermal treatment time for a SiC source.
Figure 6:
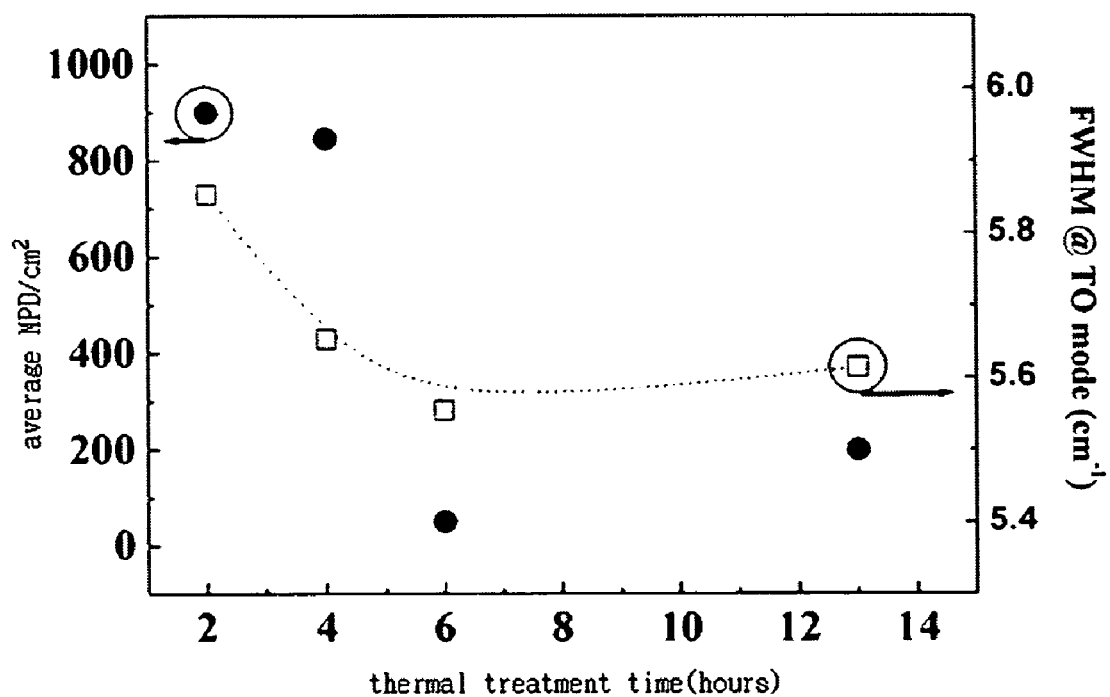
FIG. 6 is a graph showing an average micro pipes density and crystallinity determined by Raman analysis of SiC single crystals grown by using SiC source applying the variation of thermal treatment time.
Figure 7:
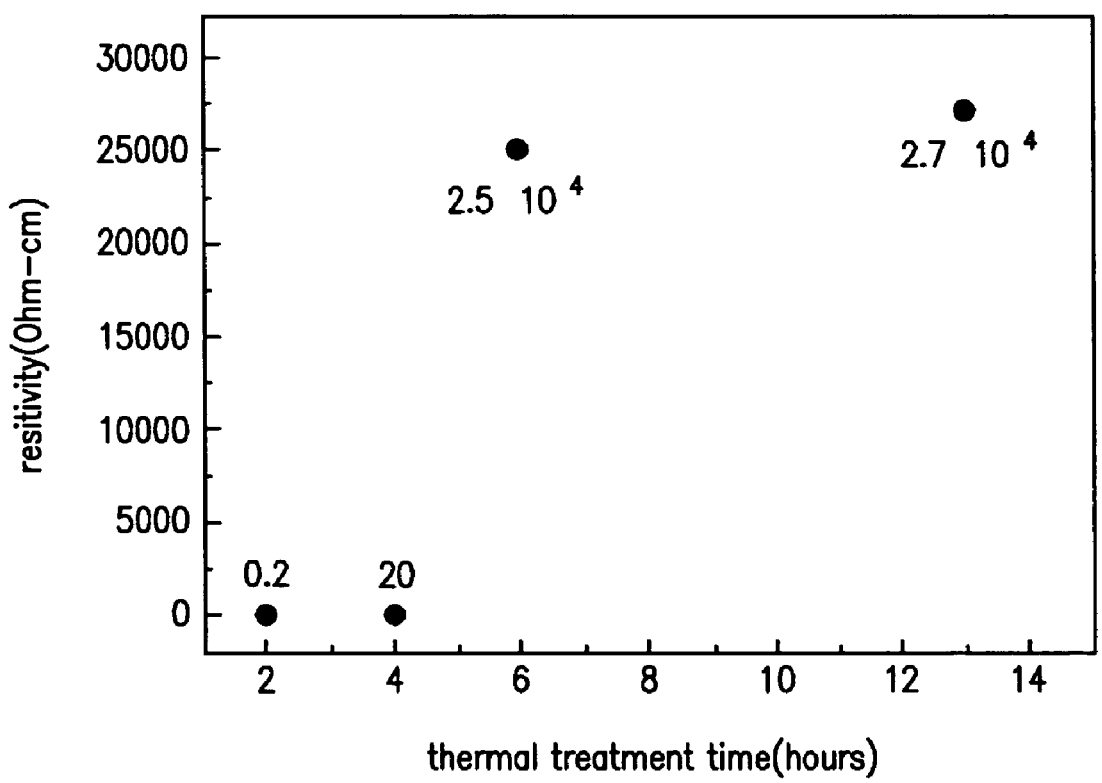
FIG. 7 is a graph showing resistivity characteristics of SiC single crystal substrates fabricated by using SiC source applying the variation of thermal treatment time.

FIG. 5 is a graph showing a SiC volume ratio of α-phase and an area ratio of porous powder according to the thermal treatment time, FIG. 6 is a graph showing an average MPD (micro pipe density) and a Raman peak of the SiC source according to the thermal treatment time, and FIG. 7 is a graph showing resistivity of a single crystal substrate according to the thermal treatment time.

As shown in FIG. 5, as the thermal treatment time increased, α-phase SiC was increased, and the amount of the porous powder was decreased as compared to the crystal powder.

This means that generation of the Si micro-droplets was held back by lowering the partial pressure of the Si vapor in the growing cavity in which the growth of the SiC single crystal was actually performed. Accordingly, it also means that generation of the micro pipes was held back.

In addition, as shown in the FWHM of Raman peak and the MPD of FIG. 6, as the thermal treatment time increased, Full Width at Half Maximum (FWHM) of the Raman peak was decreased, meaning that the crystallinity was improved.

The average MPD was decreased as the thermal treatment time increased. The optimized thermal treatment time was 6 hours under the above conditions.

In addition, as shown in FIG. 7, the resistivity of the single crystal substrate was increased as the thermal treatment time increased, meaning that the partial pressure of the Si vapor formed from the thermal treated powder source was lowered relatively such that the residual nitrogen was not mixed.

Meanwhile, a thermal treatment of a SiC powder source was performed under different conditions of 2450° C., 600 Torr for 1 hour. In this case, similar volume ratio of the α-phase and area ratio of the porous powder was obtained, meaning that a relatively short thermal treatment time is required when the thermal treatment is performed at a high temperature.

Experimental Example 2

An experiment was carried out for samples of SiC-01 to SiC-11. The first thermal treatment was performed under the same conditions for each of the samples. The second thermal treatment and the growth were performed under different conditions for each of the samples.

Table 1 shows the conditions of the first thermal treatment, the second thermal treatment, and the growth of the SiC single crystals.

TABLE 1

| | Sample name | SiC-01 | SiC-02 | SiC-03 | SiC-04 | SiC-05 | SiC-06 | SiC-07 | SiC-08 | SiC-09 | SiC-10 | SiC-11 |
|---|---|---|---|---|---|---|---|---|---|---|---|---|
| 1st-treatment Process | Temp. (° C.) | 2030 | 2030 | 2030 | 2030 | 2030 | 2030 | 2030 | 2030 | 2030 | 2030 | 2030 |
| | Time (hrs) | 3 | 3 | 3 | 3 | 3 | 3 | 3 | 3 | 3 | 3 | 3 |
| 2nd-treatment Process | Additional Si powder (wt %) | — | — | — | — | 0.1 | 0.1 | 0.1 | 0.3 | 0.3 | 0.3 | 2.0 |
| | Temp. (° C.) | — | — | — | — | 1800 | 1800 | 1800 | 1800 | 1800 | 1800 | 1800 |
| | Time (hrs) | — | — | — | — | 3 | 3 | 3 | 3 | 3 | 3 | 3 |
| Growth Process | Seed face | Si | Si | Si | Si | Si | Si | Si | Si | Si | Si | Si |
| | Nitrogen addit-ion ratio (%) | 0.0 | 3.0 | 5.0 | 30.0 | 0.0 | 3.0 | 5.0 | 0.0 | 0.5 | 3.0 | 3.0 |
| | Temp. (° C.) | 2200 | 2200 | 2200 | 2200 | 2180 | 2170 | 2180 | 2200 | 2200 | 2200 | 2200 |
| | Pressure (Torr) | 10 | 10 | 10 | 10 | 10 | 10 | 10 | 10 | 10 | 10 | 10 |

Figure 8:
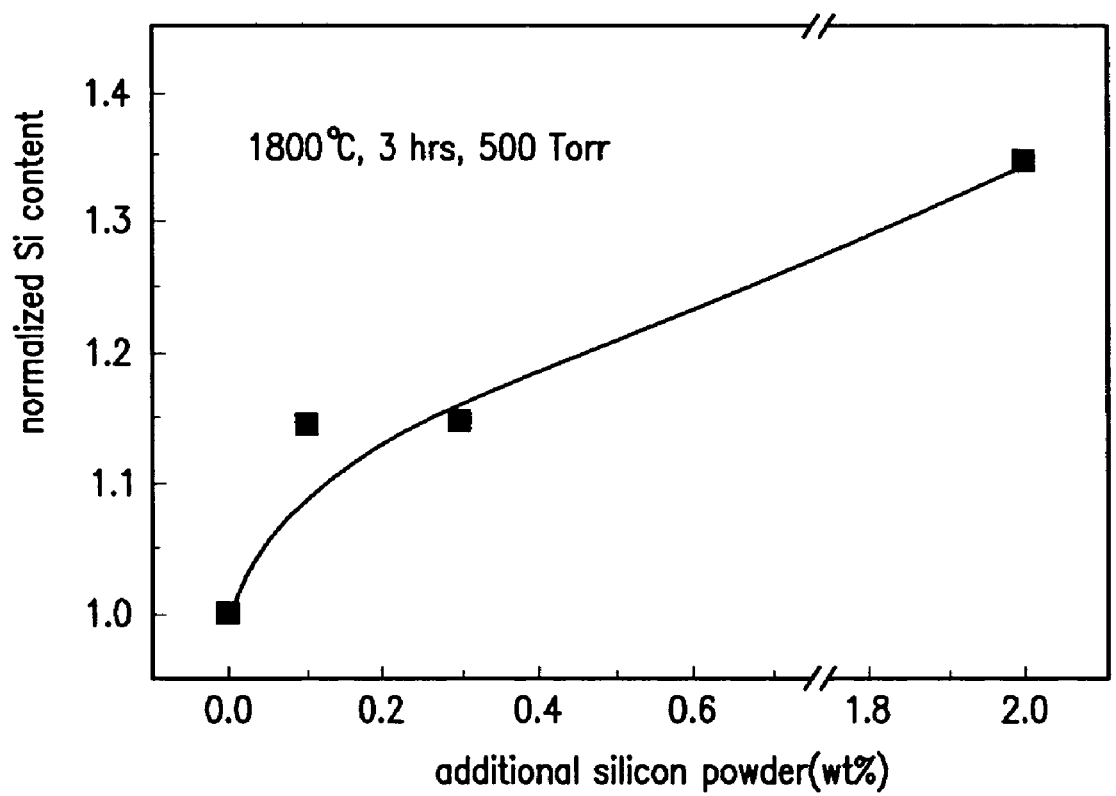
FIG. 8 is a graph showing a normalized amount of Si according to the amount of Si powder addition.

FIG. 8 is a graph showing a normalized Si concentration in the Si source according to the additional powder. As shown in FIG. 8, as the amount of additional Si powder was increased, the Si concentration of the final SiC source was linearly increased.

Figure 9:
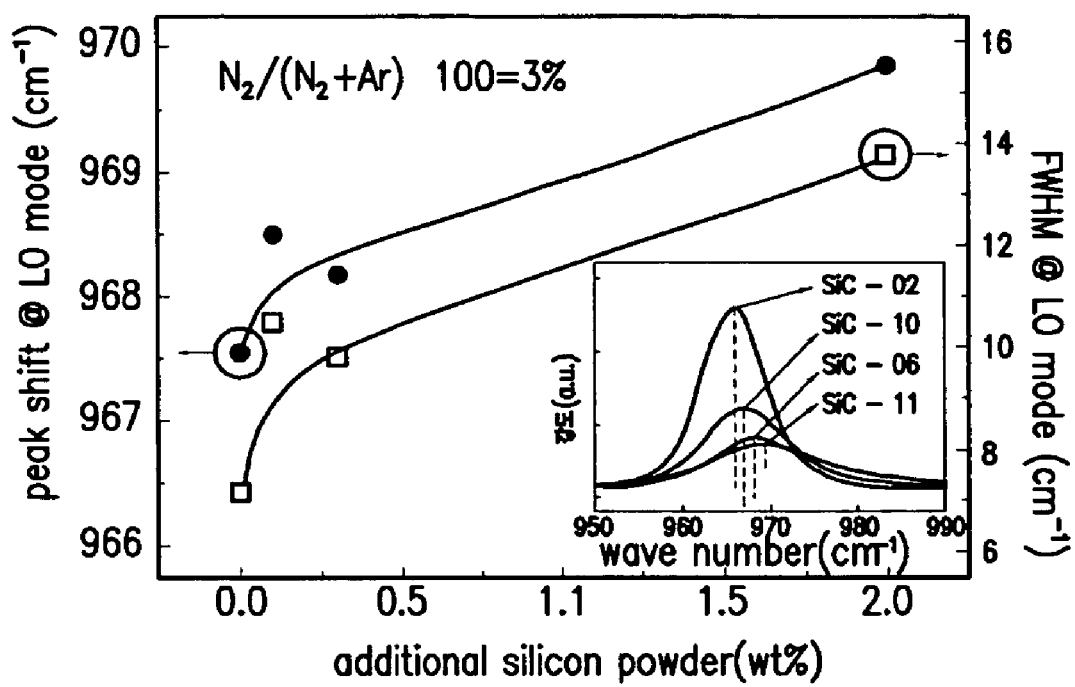
FIG. 9 is a graph showing peak shifts and a FWHM of Raman spectrums according to the amount of Si powder addition.

FIG. 9 is a graph showing a shift of LO mode spectrum and a FWHM according to the additional Si powder.

As shown in FIG. 9, when the additional nitrogen was fixed to 3 wt % and the Si concentration was changed, the LO mode spectrum was moved to a higher wave number, and the FWHM was increased.

This indicates that the carrier concentration in the SiC single crystal was increased according to the increase of the Si concentration.

Figure 10:
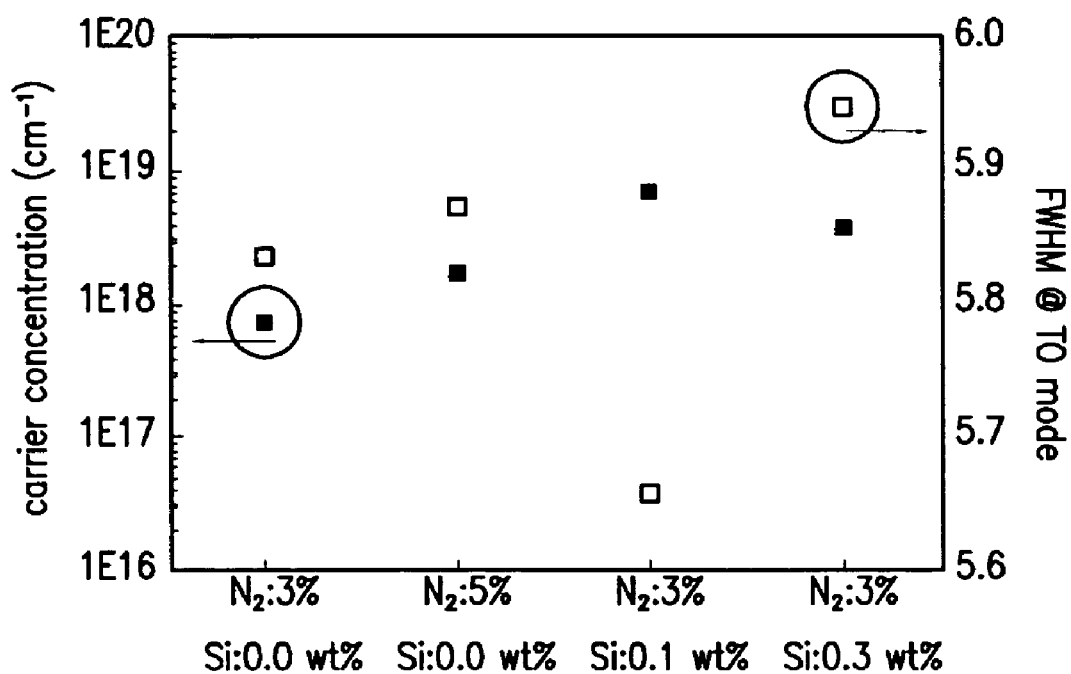
FIG. 10 is a graph showing carrier concentrations of SiC single crystals grown with addition of Si powder and SiC single crystals grown without addition of Si powder.

FIG. 10 is a graph showing carrier concentrations of a SiC single crystal grown with addition of the Si powder and a SiC single crystal grown without addition of the Si powder.

As shown in FIG. 10, the crystallinity of the single crystal with 3% of nitrogen added with 0.1 wt % and 0.3 wt % of Si powder was superior to that of the single crystal with 3% of nitrogen without any added Si powder. The carrier concentration of the former was also higher than the latter.

As described above, higher nitrogen concentration was measured by adding the high purity Si and the thermal treatment in the same additional nitrogen content. Accordingly, a high nitrogen concentration in the single crystal could be embodied without increasing the additional nitrogen during the single crystal growth.

As described above, according to the growing method of SiC of the present invention, a high quality SiC single crystal having less defects can be obtained.

What is claimed is:

1. A growing method of a SiC single crystal comprising the steps of:
    performing a first thermal treatment on a SiC source for decreasing a specific surface area, increasing a ratio of α-phase and making a mole fraction of C greater than that of Si in the source;
    performing a second thermal treatment on the SiC source, high purity Si being added in performing the second thermal treatment on the SiC source;
    providing the SiC source into a crucible;
    arranging a single SiC seed in the crucible;
    growing the SiC single crystal by heating the SiC source;
    wherein the first thermal treatment of the SiC source is carried out at a temperature of 1500 to 2600° Celsius and at a pressure of 50 to 4000 Torr; and
    after performing the first thermal treatment a value of $A_{cry}/(A_{cry}+A_{porous})$ ranges from about 0.8600 to about 0.8625 for the SiC source, where $A_{cry}$ is an area percent of a crystal powder and $A_{porous}$ is an area percent of a porous powder.

2. The method of claim 1, wherein a hydrocarbon gas is mixed with the SiC source during the first thermal treatment step.

3. The method of claim 1, wherein the SiC source contains an α-phase SiC powder equal or greater than 10 vol % through the step of the first thermal treatment.

4. The method of claim 1, wherein the second thermal treatment step is carried out at a temperature of 1300 to 2500° Celsius and at a pressure of 50 to 4000 Torr.

5. The method of claim 1, wherein 0.05 to 3 wt % of the high purity Si is added to the SiC source.

6. The method of claim 1, wherein the high purity Si is a Si powder or a Si compound gas.

7. The method of claim 1, wherein the high purity Si is a Si compound gas is silane, silicon chloride, or an organic silicon compound.

8. The method of claim 1, wherein the SiC seed has a hexagonal (6H, 4H, 2H) structure of which a diameter is equal or less than 8 inches.

9. The method of claim 1, wherein the single crystal is grown from one of the SiC seed orientations of {0001}, {1100), {1120}, and {0338}.

10. The method of claim 1, wherein in the step of growing the SiC single crystal, a hydrocarbon gas with He or $H_2$ gas is supplied, and a $SiH_4$ gas is supplied with He gas.

11. The method of claim 1, wherein, in the growing step, 4H, 6H, 3C, or 15R poly type SiC single crystal is grown on the SiC seed.

* * * * *